(12) United States Patent
Cliff

(10) Patent No.: US 6,526,461 B1
(45) Date of Patent: Feb. 25, 2003

(54) INTERCONNECT CHIP FOR PROGRAMMABLE LOGIC DEVICES

(75) Inventor: Richard G Cliff, Milpitas, CA (US)

(73) Assignee: Altera Corporation, San Jose, CA (US)

( * ) Notice: Subject to any disclaimer, the term of this patent is extended or adjusted under 35 U.S.C. 154(b) by 803 days.

(21) Appl. No.: 08/896,001

(22) Filed: Jul. 17, 1997

Related U.S. Application Data

(60) Provisional application No. 60/022,131, filed on Jul. 18, 1996.

(51) Int. Cl.[7] ............................................. G06F 13/00
(52) U.S. Cl. ..................... 710/100; 710/131; 712/10; 712/15; 712/16; 712/20; 326/40; 326/41; 326/39
(58) Field of Search ......................... 395/280; 710/100, 710/131; 712/20, 10, 15, 16; 326/41, 40, 39

(56) References Cited

U.S. PATENT DOCUMENTS

| | | | | |
|---|---|---|---|---|
| 5,028,821 A | * | 7/1991 | Kaplinsky | 326/41 |
| 5,263,149 A | * | 11/1993 | Winlow | 395/500 |
| 5,414,638 A | * | 5/1995 | Verheyen et al. | 364/489 |
| 5,515,440 A | * | 5/1996 | Mooney et al. | 380/25 |
| 5,535,165 A | * | 7/1996 | Davis et al. | 365/201 |
| 5,617,042 A | * | 4/1997 | Agrawal | 326/39 |
| 5,642,262 A | * | 6/1997 | Terrill et al. | 361/783 |
| 5,815,726 A | * | 9/1998 | Cliff | 395/800.1 |

* cited by examiner

*Primary Examiner*—Rupal Dharia
(74) *Attorney, Agent, or Firm*—Townsend and Townsend and Crew, LLP; Charles J. Kulas

(57) ABSTRACT

A method and apparatus for interconnecting multiple programmable logic devices. In a preferred embodiment of the invention, an interconnect chip couples one programmable logic device to another programmable logic device. The interface between devices takes place within the interconnect chip, which can be configured using available routing software, thereby sparing the user the task of routing the connections between devices on the board.

18 Claims, 3 Drawing Sheets

INTERCONNECT CHIP FOR PROGRAMMABLE LOGIC DEVICES

This application claims the benefit of a provisional application No. 60/022,131, filed Jul. 18, 1996, which is incorporated herein by reference.

BACKGROUND OF THE INVENTION

The present invention relates to the field of integrated circuits and their operation. More specifically, in one embodiment the invention provides an interconnect chip to couple a plurality of programmable logic devices to each other.

Logic devices and methods of their operation are well known to those of skill in the art. Programmable logic devices have found particularly wide application as a result of their combined low up-front cost and versatility to the user.

Altera's FLEX® and MAX® lines of programmable logic are among the most advanced and successful programmable logic devices. In the FLEX® 8000 logic devices, for example, a large matrix of logic elements (LEs) is utilized. In one commercial embodiment of such devices, each LE includes a 4-input look-up table for performance of combinational logic (e.g., AND, OR, NOT, XOR, NAND, NOR, and many others) and a register that provides sequential logic features.

The LEs are arranged in groups of, for example, eight to form larger logic array blocks (LABs). The LABs contain, among other things, a common interconnection structure. The various LABs are arranged in a two-dimensional array, with the various LABs connectable to each other and to pins of the device though continuous lines that run the entire length/width of the device. These lines are referred to as row interconnect (GH) and column interconnect (GV) or "global" interconnect lines.

The MAX® 7000 logic devices by way of contrast utilize what are commonly referred to as "macrocells" (analogous to LEs) as a basic logic element. The macrocells are arranged in groups of, for example, sixteen to form larger logic array blocks (LABs). A programmable interconnect array (PIA) selectively links together the multiple LABs. The PIA is a global bus that is fed by all dedicated inputs, I/O pins, and the various macrocells. The PIA is analogous to global interconnect, GHs and GVs. For example, the PIA may be fed by signals that will be used as logic inputs, global controls for secondary register functions in the LABs, input paths from I/O pins to registers that are used for setup of the device, etc.

Inputs to the LABs include inputs from pins (via I/O control blocks), the PIA, and various control (e.g. clock) pins. Logic inputs are provided to one or more of five AND devices, the outputs of which are provided to a product term select matrix. The product term select matrix selects which inputs will be provided to an OR or XOR function, or as secondary inputs to registers in the macrocell. Product terms may be shared between macrocells for complex logic functions. Outputs from the LABs are provided to the I/O control block to the PIA and/or various output pins.

The FLEX® and MAX® programmable logic devices have met with substantial success and are considered pioneering in the area of programmable logic. In fact, designers are increasingly using multiple FLEX® and MAX® devices, or even an entire array of programmable logic devices, to implement functions that are too large to be supported by a single programmable logic device. For example, it would be quite typical for a hardware designer to emulate a complex system in an array of programmable logic devices as a prototype before implementing the tested design in an application specific integrated circuit (ASIC) for production. In order to use multiple devices, the designer must find ways to overcome several hurdles, including partitioning the design into smaller portions to be parceled out among the multiple devices, finding an optimum placement for the multiple devices on a circuit board, and routing the connections between devices.

These steps need to be repeated each time there is a change in the system design. Currently, there is partitioning software that breaks a design up into smaller pieces in a logical manner to divide the design among several programmable logic devices. However, the other tasks of placing and routing among devices are left to the user of the devices. When using a single programmable logic device, the user may simply leave the tasks of placing and routing logic cells to the appropriate routing software, such as, for example, Altera's MAXPlus+® software package. But on a system level, there is currently no such device or software to ease the job of the designer in a similar fashion.

Thus, a need clearly exists for a device to interconnect multiple programmable logic devices that does not place the entire burden on the user.

SUMMARY OF THE INVENTION

The present invention provides a method and apparatus for interconnecting multiple programmable logic devices. In a preferred embodiment of the invention, an interconnect chip couples one programmable logic device to another programmable logic device. The interface between devices takes place within the interconnect chip, which can be configured using available routing software, thereby sparing the user the task of routing the connections between devices on the board.

A further understanding of the nature and advantages of the inventions herein may be realized by reference to the remaining portions of the specification and the attached drawings.

DESCRIPTION OF THE PREFERRED EMBODIMENT

Figure 1:
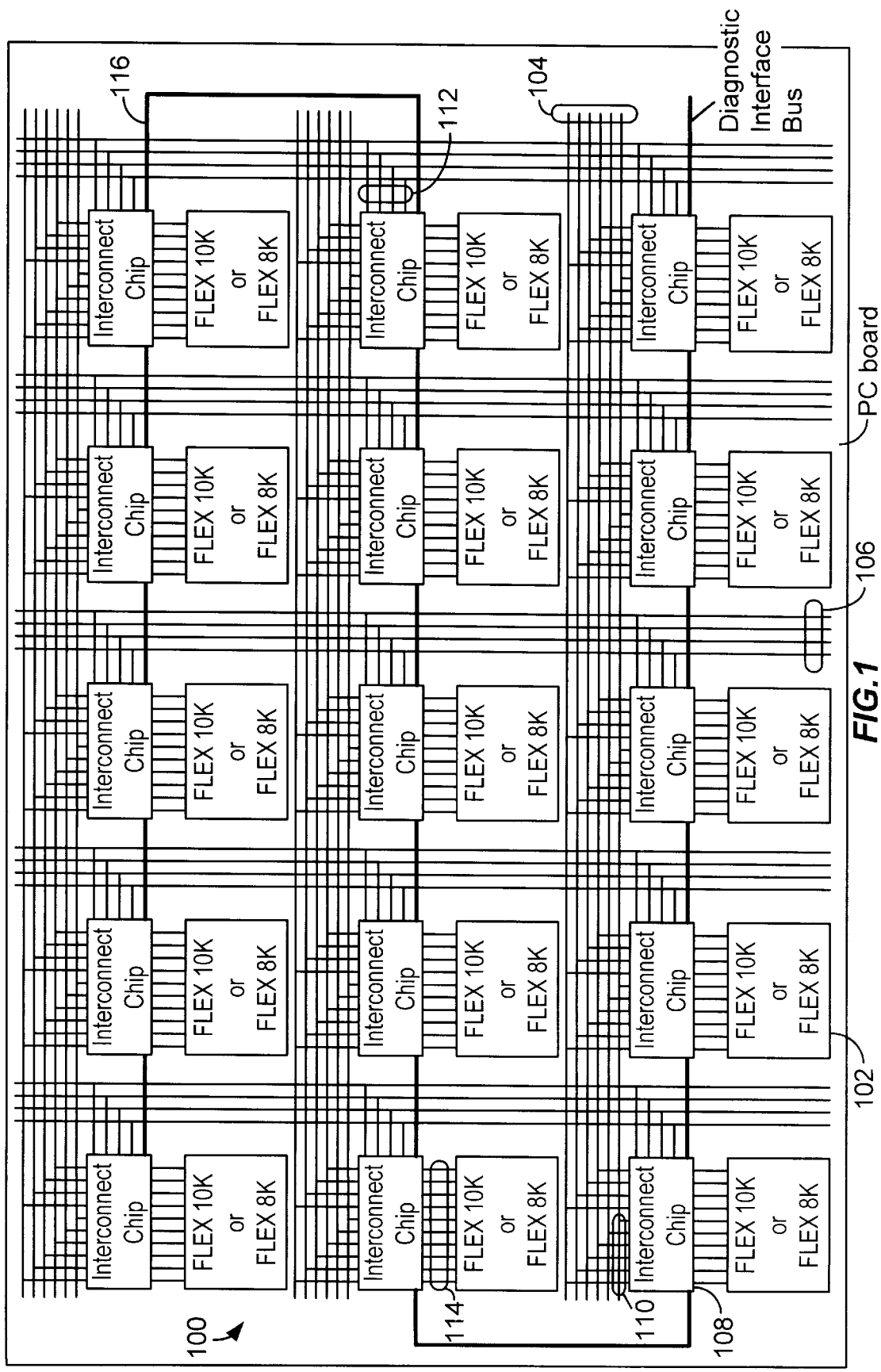
FIG. 1 shows an exemplary array of programmable logic devices connected by a plurality of interconnect chips according to the present invention.

FIG. 1 shows an exemplary array 100 of programmable logic devices connected by a plurality of interconnect chips according to the present invention. Merely by way of example, the programmable logic devices may be Altera's FLEX® 8000 or FLEX® 10000 devices, as shown in the figure, but clearly other programmable logic devices may be implemented with the present invention. In FIG. 1, programmable logic devices (PLD) 102 are arranged in an array and are coupled by horizontal conductors 104 and vertical conductors 106. In the embodiment shown, each programmable logic device has a corresponding interconnect chip 108 coupling the device to conductors 104 and 106. In alternate embodiments, there may be one interconnect chip 108 that couples multiple programmable logic devices 102 to the conductor network. The optimal number of conductors 104 and 106 needed to connect the array of programmable logic devices 102 may be calculated by Rent's Rule, which is the well-known rule used to predict wire counts.

In a preferred embodiment, interconnect chip 108 may be programmably coupled to horizontal conductors 104 by connectors 110. Similarly, interconnect chip 108 may be programmably coupled to vertical conductors 106 by connectors 112. Interconnect chip 108 then couples conductors 104 and 106 to programmable logic device 102 through connectors 114. An optional diagnostic bus 116 may be added to directly couple all interconnect chips 108 serially. Interconnect chip 108 could also provide an interface to external memory, such as a RAM (not shown), if desired. Alternately, some other RAM interface could be employed in conjunction with the interconnect chip.

Figure 2:
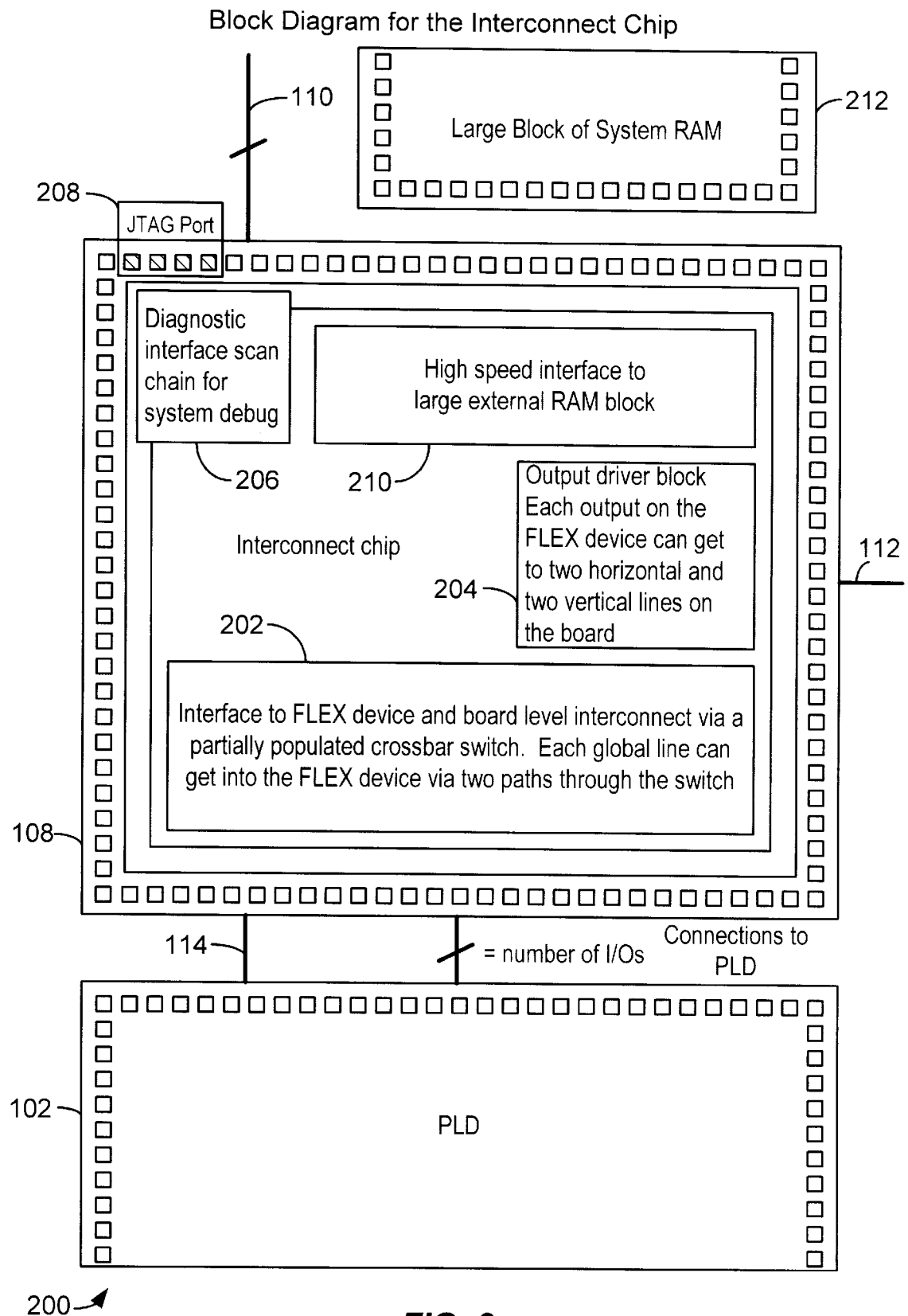
FIG. 2 shows a detailed block-level diagram of an interconnect chip according to the present invention.

FIG. 2 shows a more detailed block-level diagram 200 of an interconnect chip 108. As noted above, interconnect chip 108 is coupled to a programmable logic device 102 (such as a FLEX device) by connectors 114. Connectors 110 couple interconnect chip 108 to the horizontal network of conductors (shown in FIG. 1), while connectors 112 couple interconnect chip 108 to the vertical network of conductors.

Input driver block 202 includes an interface to input signals from the horizontal and vertical conductors to programmable logic device 102. Input driver block 202 will typically be implemented by a partially populated crossbar switch to allow for programmable interconnections. In a preferred embodiment, each global conductor 104 and 106 has two access paths to PLD 102 through the crossbar switch. Output driver block 204 is used to output signals from programmable logic device 102 to the network of horizontal and vertical conductors. In one embodiment, each output from PLD 102 can be sent to two horizontal conductors 104 and two vertical conductors 106 through output driver block 204. The number of connections between conductors 104, 106 and PLD 102 may of course be changed in alternate embodiments. Additionally, horizontal conductors 104 are coupled to vertical conductors 106 through interface blocks 202 and 204.

Interconnect chip 108 also may include a diagnostic interface block 206 that is coupled to diagnostic bus 116 (FIG. 1) through JTAG port 208 for testing purposes. Furthermore, a memory interface block 210 may be included to provide a high speed interface to an external memory block 212 that may be, for example, a large block of system RAM.

As noted above, when using a single programmable logic device, the user may simply leave the tasks of placing and routing logic cells to the appropriate routing software, such as, for example, Altera's MAXPlus+® software package. A key advantage of interconnect chip 108 of the present invention is that the user may employ the same (or very similar) routing software algorithms used for a single PLD to route the connections between PLDs 102 through interconnect chips 108, even though the connections are being made on a system level. Interconnect chip 108 eliminates routing problems that might arise from random pin assignments in the PLDs, since the multiplexing structure in interconnect chip 108 is more fully populated than the multiplexing structure internal to a programmable logic device 102. First, the design is partitioned into rows of PLDs 102, based on the number of logic elements and number of pins required. The PLDs 102 are then arranged by rows to minimize the vertical interconnect. The multiplexer allocator completes the routing at the board level across the global horizontal and vertical conductors 104 and 106. The overall utilization of each PLD 102 is improved because input/output resources of a PLD are not used for routing signals across the board. Instead, interconnect chip 108 handles this function, freeing up space in each PLD 102 for logic functions. This has the added benefit of possibly reducing the overall number of PLDs 102 required for any given design.

Figure 3:
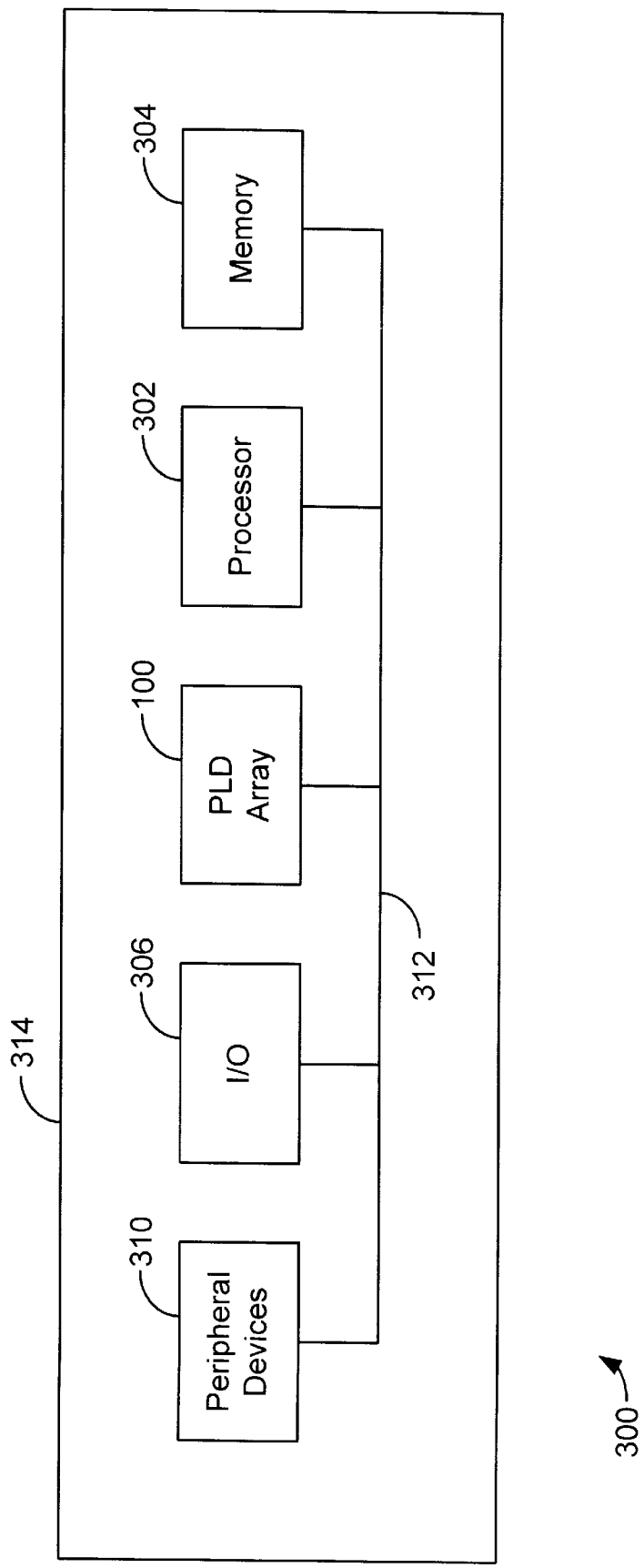
FIG. 3 shows the use of a PLD array and associated interconnect chips according to the present invention in an exemplary data processing system.

FIG. 3 illustrates the use of a PLD array 100 and associated interconnect chips 108 (shown in FIG. 31) of the present invention in an exemplary data processing system 300. Data processing system 300 may include one or more of the following components: a processor 302, memory 304, I/O circuitry 306, and peripheral devices 310. These component are coupled together by a system bus 312 and are contained in an end-user system 314.

Data processing system 300 can be used in a wide variety of applications, such as computer networking, data networking, instrumentation, video processing, digital signal processing, or any other application where the advantage of using reprogrammable logic is desirable. PLD array 100 may be used to implement a processor or controller that works in cooperation with processor 302. PLD array 100 may also be used as an arbiter for arbitrating access to a shared resource in system 300. In yet another example, PLD array 100 may be configured as an interface between processor 302 and one of the other components in system 300. The above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. A system comprising:
    a plurality of programmable logic devices configured in an array;
    horizontal conductors for interconnecting logic devices in rows in the array:
    vertical conductors for interconnecting logic devices in columns in the array, and
    an interconnect chip associated with each logic device and coupled to an associated logic device and to a vertical and horizontal conductor.

2. The system of claim 1, wherein said interconnect chip further comprises:
    an input driver block for routing input signals from said first programmable logic device to said second programmable logic device; and
    an output driver block for routing output signals from said first programmable logic device to said second programmable logic device.

3. The system of claim 1 further comprising a diagnostic bus serially coupling said plurality of programmable logic devices.

4. The system of claim 3 wherein said interconnect chip further comprises a diagnostic interface block coupled to said diagnostic bus.

5. The system of claim 1 further comprising a block of user memory.

6. The system of claim 5 wherein said interconnect chip further comprises a memory interface block coupled to said block of user memory.

7. In a system comprising a plurality of programmable logic devices configured in an array so that multiple logic devices are arranged in rows and columns and wherein a logic device can communicate with other logic devices in the same row and column, a diagnostic bus and a block of user memory, an interconnect chip associated with each logic device and automatically configured by routing software for coupling a first programmable logic device to a second programmable logic device, said chip comprising:

an input driver block for routing input signals from a first programmable logic device to a second programmable logic device wherein the first and second logic devices are in the same row or column; and an output driver block for routing output signals from said first programmable logic device to said second programmable logic device, wherein the first and second logic devices are in the same row or column.

8. The system of claim 7 wherein said interconnect chip further comprises a diagnostic interface block coupled to said diagnostic bus.

9. The system of claim 5 wherein said interconnect chip further comprises a memory interface block coupled to said block of user memory.

10. A system comprising:

a first plurality of conductors;

a second plurality of conductors;

a plurality of programmable logic devices arranged in an array among said first plurality and said second plurality of conductors, wherein said first and second plurality of conductors arranged to provide communication between logic devices in the same row or column; and a plurality of interconnect chips for coupling a first programmable logic device to a second programmable logic device, said interconnect chips being automatically configured by routing software, wherein there is an interconnect chip associated with each logic device in the array on a one-to-one basis.

11. The system of claim 10 wherein each programmable logic device has a corresponding interconnect chip.

12. The system of claim 10 wherein at least one of said interconnect chips further comprises:

an input driver block for routing input signals from said first programmable logic device to said second programmable logic device; and an output driver block for routing output signals from said first programmable logic device to said second programmable logic device.

13. The system of claim 10 further comprising a diagnostic bus serially coupling said plurality of programmable logic devices.

14. The system of claim 13 wherein said interconnect chip further comprises a diagnostic interface block coupled to said diagnostic bus.

15. The system of claim 10 further comprising a block of user memory.

16. The system of claim 15 wherein said interconnect chip further comprises a memory interface block coupled to said block of user memory.

17. A data processing system comprising:

a system bus;

a processor coupled to said system bus;

a block of user memory coupled to said system bus;

input/output circuitry coupled to said system bus;

peripheral devices coupled to said system bus;

an array of programmable logic devices coupled to said system bus, wherein said logic devices are arranged in rows and columns; and a plurality of interconnect chips coupling said array of programmable logic devices, said interconnect chips being automatically configured by routing software wherein there is an interconnect chip associated with each logic device in the array on a one-to-one basis and wherein the interconnect chips allow communication of information between logic devices in the same row or column.

18. The system of claim 17 wherein at least one of said interconnect chips further comprises:

an input driver block for routing input signals from a first programmable logic device to a second programmable logic device; and an output driver block for routing output signals from said first programmable logic device to said second programmable logic device.

* * * * *